MIX-CRYSTAL SEMICONDUCTOR DEVICES

Original Filed Nov. 30, 1959 2 Sheets-Sheet 1

INVENTOR.

Otto Gert Folberth

INVENTOR.
Otto Gert Folberth

United States Patent Office 3,259,582

Patented July 5, 1966

3,259,582

MIX-CRYSTAL SEMICONDUCTOR DEVICES

Otto Gert Folberth, Boblingen, Germany, assignor to Siemens-Schuckertwerke Aktiengesellschaft, Berlin-Siemensstadt, Germany Original application Nov. 30, 1959, Ser. No. 856,087. Divided and this application Feb. 24, 1964, Ser. No. 346,740

6 Claims. (Cl. 252—62.3)

Figure 1:
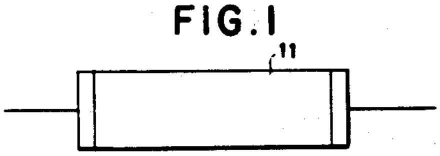
Figure 2:
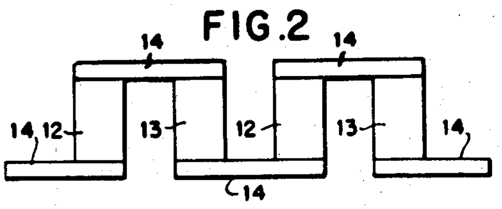

This is a division of my application Serial No. 856,087, filed November 30, 1959, now patent No. 3,140,998. My invention relates to improvements in mix-crystal semiconductor devices and is described herein with reference to the accompanying drawings in which FIGS. 1 and 2 show schematically two respective examples of electrical semiconductor devices and FIGS. 3 to 6 are graphs indicative of characteristic properties of various crystalline compositions used as semiconductors in such devices according to the invention.

In a more specific aspect, my invention concerns semiconductor devices whose active semiconductor body consists of a solid solution or mixed crystal of two chemical compounds. Semiconductors of this type are known from my Patent 2,858,275 issued October 28, 1958, and assigned to the assignee of the present invention. The semiconductors according to the patent are formed by two binary compounds—such as InAs and InP, or GaAs and GaP—which are both of the $A^{III}B^{V}$ type known from Patent 2,798,989 of W. Welker, issued July 9, 1957 and assigned to the assignee of the present invention. There are other known semiconductor devices whose crystalline body constitutes a solid solution or mixed crystal of polycrystalline or monocrystalline constitution, formed by two stoichiometric compounds of respective elements from different groups of the periodic system, such as those of the $A^{IV}B^{VI}$ type. It should be understood that the letters A, B, C, D etc. herein used in general formulas denote different elemental substances from the periodic-system groups indicated by the Roman numerals of the raised subscripts, and that the formulas indicate the stoichiometric proportion of one atom of one element to one atom of the other, unless a different atomic proportion, such as in $Mg_2Sn$, is indicated by lowered subscripts. Thus, the above-mentioned solid solution of InAs and InP may also be written as $In(As_xP_{1-x})$, wherein $x$ is sufficiently larger than zero and sufficiently smaller than unity ($0<x<1$) to obtain a mix-crystal substance of semiconductor properties appreciably different from those of the two component binary compounds InAs and InP. Such mix-crystal semiconductors afford obtaining property values that are intermediate those of the two component binary compounds and thus permit "tailoring" the crystalline semiconductor body, as regards its properties, to the requirements of a particular application, as is more fully set forth in my above-mentioned Patent 2,858,275.

It has further been found that a generally similar bridging, as to properties, between different binary semiconductor compounds of the $A^{III}B^{V}$ type can be obtained by substituting at least one of its two elemental components in equal atomic shares by two elements from left and right neighboring groups respectively of the periodic system. Such a "substituted" $A^{III}B^{V}$ compound may have the form $C^{II}D^{IV}B^{V}_2$ in which each two atoms of the $A^{III}$ element of the original compound $A^{III}B^{V}$ are substituted by one atom $C^{II}$ from the second group and one atom $D^{IV}$ from the fourth group. An example of such a substituted $A^{III}B^{V}$ compound, analogous to InAs, is the stoichiometric ternary compound $CdSnAs_2$, wherein one atom of Cd and one atom of Sn replace each two atoms of In. Such substituted $A^{III}B^{V}$ compounds are dealt with in the printed and published German patent application DAS 1,044,980.

It is an object of my invention to afford further improvements, not only as regards the available variety of semiconductor properties but also relative to thermal conductance and related or dependent properties.

I have discovered that such improvements are achieved by forming the crystalline semiconductor of a binary semiconductor compound in solid solution or mixed crystal with a substitute of that compound. Preferably, the crystalline body of semiconductor devices according to the invention is a mixed crystal of the type $$AB+CDB_2$$

wherein AB is any stoichiometric binary compound of two elements A, B from respectively different groups of the periodic system, and $CDB_2$ is a substituted AB compound in which each two atoms of one of the two elements (A) are substituted by one atom C and one atom D from respective groups at the left and right respectively of the group to which the A element appertains, it being understood that the C and D groups also differ from the B group. For unlimited solid solubility of the two component compounds AB and $CDB_2$, the formula can be written as:

$$(C_{x/2}A_{1-x}D_{x/2})B$$

wherein $0<x<1$ in the sense explained above. For any value of $x$ within the stated limits, the composition of the crystal is stoichiometric in the sense that one sublattice is occupied by B atoms, whereas the other sublattice is occupied by A, C and D atoms of the same total number as the B atoms.

Comprehensive series of tests made with a great variety of such stoichiometric substances have shown that, regardless of differences in other properties, they have in common that their thermal conductance does not vary monotonously from that of one component (AB) to that of the other ($CDB_2$) but is always reduced relative to the conductance of the compositionally nearest component, and that such reduction is greater than any accompanying reduction in electric properties. In many cases, the thermal conductance exhibits a very pronounced minimum. This renders such semiconductors particularly well applicable for semiconductor uses requiring low thermal conductance or a low ratio of thermal to electric conductance as is the case in thermoelectric devices, thermistors or photo-responsive resistors, aside from other uses mentioned below.

The drawing shows by way of example in FIG. 1 a thermistor or other semiconducting resistor whose body 11 consists of a solid solution or mixed crystal according to the invention, and in FIG. 2 a thermopile whose individual members 12 and 13 consist of substances according to the invention having respectively different thermoforces. The members 12 and 13 may consist of one and the same substance except that the members 12 are doped for p-type conductance and the members 13 have n-type conductance. The members are joined together by copper bars 14. The device of FIG. 2 is suitable as a voltage generator, for example.

Before dealing with further features and examples of the invention, the following explanatory remarks will be of interest.

In referring to the various groups of the periodic system, it is understood that the helium group of inert gases is excluded. It is further understood that not all of the elements in groups I through VII can be combined to form a binary compound constituting a solid-state semiconductor at technologically useful temperatures, and that the bond character of some of the binary, solid compounds would be too ionic for electric semiconductor purposes.

In other words, the invention naturally involves only those element combinations or binary-ternary mixed crystals that do form semiconducting compounds. In many cases, the known binary semiconductor compounds are in the nature of intermetallic compounds formed of respective elements from different b-subgroups of the periodic system. The elements that form binary compounds and their ternary substitutes suitable for the purposes of the invention and mentioned in this specification are listed in Table No. I.

TABLE I

| I | II | III | IV | V | VI |
|---|---|---|---|---|---|
| Li | ---- | B | C | N | O |
| ---- | Mg | Al | Si | P | S |
| Cu | Zn | Ga | Ge | As | Se |
| Ag | Cd | In | Sn | Sb | Te |
| Au | Hg | ---- | Pb | Bi | |

The binary compounds to be used as one of the components of a semiconducting mix-crystal for the purposes of the invention are generally formed of respective elements in non-adjacent groups. Thus the elements of $A^{III}B^{V}$ compounds, for example GaAs, are spaced one group apart, and this also applies to the $A^{IV}B^{VI}$ semiconductors such as PbTe, and to $A^{II}_2B^{IV}$ semiconductors such as $Mg_2Sn$, whereas the elements of the semiconducting HgTe compound are spaced three groups apart. In such cases the analogous substitutes thus bring an element of an intermediate group into the crystal lattice.

According to a more specific and preferred feature of my invention, the crystalline body of a semiconductor device of reduced thermal conductance, particularly a thermoelectric device, consists of an $A^{III}B^{V}$ compound in solid solution with a ternary substitute of that compound. The $A^{III}B^{V}$ semiconductor compounds thus applicable are the nitrides, phosphides, arsenides and antimonides of boron, aluminum, gallium and indium, namely the compounds BN, AlN, GaN, InN, BP, AlP, GaP, InP, BAs, AlAs, GaAs, InAs, BSb, AlSb, GaSb and InSb. The substituted $A^{III}B^{V}$ compound contained in the solid solution is preferably of the type $C^{II}D^{IV}B^{V}_2$, so that the solid-solution or mix-crystal substance contains $C^{II}D^{IV}B^{V}_2$ and $A^{III}B^{V}$ in accordance with the stoichiometric formula $$(C^{II}_{x/2}A^{III}_{1-x}D^{IV}_{x/2})B^{V}$$

Such substances, used as semiconductor bodies, afford a further variation of compound-type semiconductors as regards electric semiconductor properties as well as other physical and chemical properties. Particularly the substitution of the components in one phase, while generally preserving the atom lattice structure in the general sense but disturbing the lattice properties in the range of the lattice constants, affords the possibility to considerably reduce the thermal lattice conductance with a relatively slight reduction in electric conductance. Thus, the semiconductor bodies used according to the invention permit an extremely accurate adaptation to the requirements or desiderata of the particular use intended.

This affords a wide field of application which virtually comprises all technological purposes for which semi-conductor bodies are being employed and in which use is made of the electric semiconductor properties of such crystalline bodies. Thus, aside from purely electrical uses, mix-crystal semiconductors according to the invention are applicable for galvano-magnetic purposes (for example, Hall generators and electric resistors which change their ohmic resistance in dependence upon an applied magnetic field), various thermoelectric and photoelectric purposes, as well as electro-optical uses, such as for electrically controllable filters or lenses.

Some of the preferred mix-crystal systems of the type $(C^{II}_{x/2}A^{III}_{1-x}D^{IV}_{x/2})B^{V}$ are:

(1) $(Cd_{x/2}In_{1-x}Sn_{x/2})As$
(2) $(Zn_{x/2}In_{1-x}Sn_{x/2})As$
(3) $(Zn_{x/2}In_{1-x}Ge_{x/2})As$
(4) $(Zn_{x/2}Ga_{1-x}Ge_{x/2})As$ wherein $0<x<1$ as explained above. For example, the mix-crystals:

(5) $(Cd_{0.25}In_{0.5}Sn_{0.85})As$
(6) $(Zn_{0.25}Ga_{0.5}Ge_{0.25})As$ were found to have electron mobility of approximately 1300 cm.$^2$/volt sec. and hole mobilities of approximately 17 cm.$^2$/volt sec.; their thermal conductance being far below those of the components InAs and $CdSnAs_2$.

Figure 3:
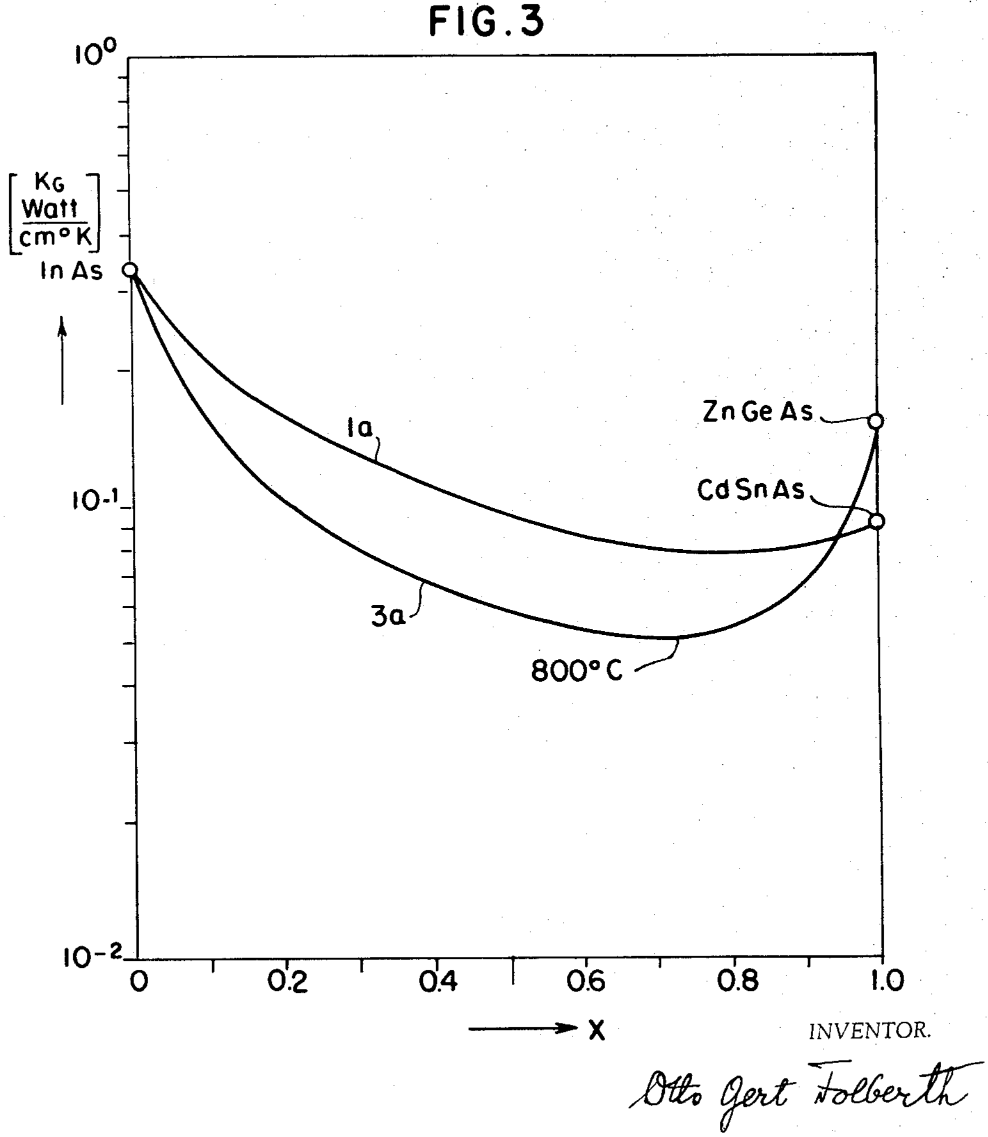
Figures 4, 5:
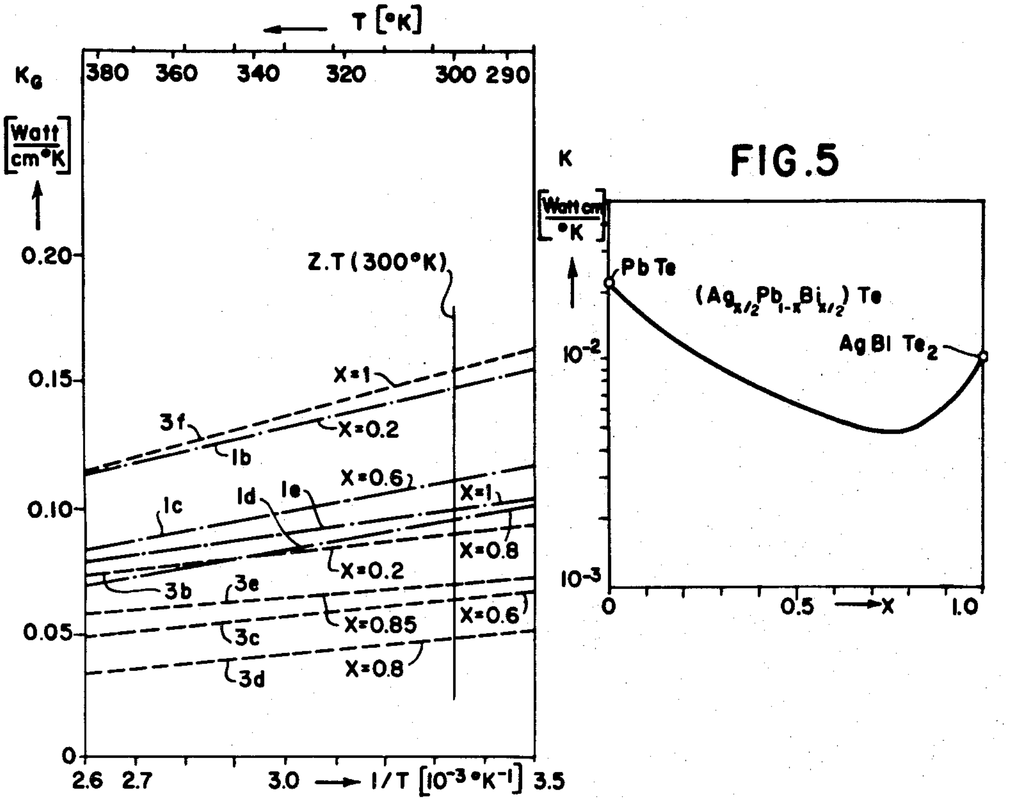

The mix-crystal system (3):$(Zn_{x/2}In_{1-x}Ge_{x/2})As$ was found to have a conspicuous minimum of the thermal lattice conductance $K_G$ at a mixing ratio of about $x=0.75$, amounting to as little as about 15% of the $K_G$ value of InAs (FIG. 3, curve 3*a*). The $K_G$ value decreases with increasing temperature (FIG. 4, curves 3*b* to 3*f*). The dependence of $K_G$ upon temperature (T), which follows a $1/T$ law in the range from 0° to 120° C., was somewhat lower than for the component compounds InAs and $ZnGeAs_2$, which constitutes another technological advantage. The measured thermal lattice conductance values $K_G$ of $(Zn_{x/2}In_{1-x}Ge_{x/2})As$ mix-crystals at 300° K. (degree Kelvin) were as follows:

TABLE II

| | x | $K_G$ (Watt cm.$^{-1}$ ° K.$^{-1}$) |
|---|---|---|
| (7) | 0.0 | [1] 0.23 |
| (8) | 0.2 | 0.087 |
| (9) | 0.6 | 0.062 |
| (10) | 0.8 | 0.047 |
| (11) | 0.85 | 0.066 |
| (12) | 0.95 | 0.089 |
| (13) | 1.00 | [1] 0.152 |

[1] For comparison.

On account of the negative temperature coefficient of $K_G$, the system is preferably suitable for use in the temperature range above normal room temperature (above 20° C.). The high melting points in the system (InAs:936° C.;

$Zn_{0.75/2}In_{0.25}Ge_{0.75/2}As$:about 880° C.; $ZnGeAs_2$:850° C.) permit using the crystal system up to high temperatures in the vicinity of these melting points. Another advantage is the fact that, up to the melting point, no phase modifications of the substances as may impair the stability will occur. By comparison, the temperature coefficient of the compound $Bi_2Te_3$, known for use at low temperatures, is negative. It is remarkable that at temperatures above normal room temperature (20° C.), the heat conductance of the substance (14):$Zn_{0.75/2}In_{0.25}Ge_{0.75/2}As$ is even lower than that of $Bi_2Te_3$.

The electric conductance and the thermoforce of the solid solutions listed in Table II, as in all such cases, are greatly dependent upon doping, so that any particular measured value of these properties is not typical as such. However, in all cases, the above-mentioned reduction in thermal lattice conductance was greater than any reduction in electric conductance so that the compositions exhibit a reduced ratio of electric to thermal conductance.

The lattice structure of the mixed-crystal system (3):$(Zn_{x/2}In_{1-x}Ge_{x/2})As$ was found to be cubic (Zinkblende type) for $x<0.8$, and tetragonal (Chalcopyrite) for $x>0.8$. In the system (1):$(Cd_{x/2}In_{1-x}Sn_{x/2})As$, the dependence of the lattice conductance upon the mixing ratio is somewhat lower, although a minimum is also observed, as is apparent from the curve 1*a* in FIG. 2. However, the reduction in thermal lattice conductance was more pronounced with increasing temperature as is apparrent from curves 1*b* through 1*e* in FIG. 4, in comparison with the curves 3*b* through 3*f* relating to the system (3): $(Zn_{x/2}In_{1-x}Ge_{x/2})As$. The thermal conductance (lattice conductance) values of the system $$(1):(Cd_{x/2}In_{1-x}Sn_{x/2})As$$

at 300° K. are listed below in Table III.

TABLE III

| | x | $K_G$ (Watt cm.$^{-1}$ ° K.$^{-1}$) |
|---|---|---|
| (15) | 0.2 | 0.146 |
| (16) | 0.6 | 0.104 |
| (17) | 0.8 | 0.088 |
| (18) | 1.0 | [1] 0.092 |

[1] For comparison.

Further examples exhibiting an analogous reduction of thermal lattice conductance as compared with electric conductance are composed as stated in Table IV:

TABLE IV

| | Binary component | Ternary component |
|---|---|---|
| (19) | AlAs | $ZnGeAs_2$. |
| (20) | GaAs | $CdGeAs_2$. |
| (21) | BP | $ZnGeP_2$. |
| (22) | AlP | $ZnGeP_2$. |
| (23) | GaP | $CdGeP_2$. |
| (24) | AlN | $ZnSiN_2$. |
| (25) | $Mg_2Sn$ | LiMgAs. |

In the semiconductor mix-crystals used according to the invention, the non-substituted elemental partner of the binary semiconductor compound in the mix-crystal, particularly the non-substituted partner of an $A^{III}B^{V}$ compound, may consist of two elements of the same group of the periodic system so that the term "binary," applied to such a modification, denotes a "two-group" rather than a "two-substance" compound. Such a compound with two elements from one group and one element from the other, in solid solution or mixed crystal formation with a substituted compound of the preferred type $A^{II}B^{IV}C^{V}_2$, results in a composition of the type $$(A^{II}_{x/2}B^{III}_{1-x}C^{IV}_{x/2})(D^{V}_{y}E^{V}_{1-y})$$

wherein $x$ and $y$ are greater than zero and smaller than unity: $0<(x,y)<1$. Examples of mix-crystals of this type are:

(26) $(Zn_{x/2}In_{1-x}Sn_{x/2})(As_yP_{1-y})$
(27) $(Zn_{x/2}In_{1-x}Sn_{x/2})(As_ySb_{1-y})$
(28) $(Zn_{x/2}Ga_{1-x}Sn_{x/2})(As_yP_{1-y})$
(29) $(Zn_{x/2}Ga_{1-x}Ge_{x/2})(As_yP_{1-y})$

In the following examples, the group-III member of the binary (two-group) semiconductor compound is constituted by two elements from that group:

(30) $(Zn_{x/2}In_{(1-x)z}Ga_{(1-x)(1-z)}Ge_{x/2})As$
(31) $(Zn_{x/2}In_{(1-x)z}Ga_{(1-x)(1-z)}Sn_{x/2})As$

Furthermore, a semiconductor device according to the invention may be provided with a semiconductor body in which the elements of the substituted component or components, as well as such component or components themselves, are partially substituted by elements of the same group of the periodic system. The corresponding stoichiometric crystal compositions are of the type $$\left[\left(A^{II}_{xy/2}\,B^{II}_{\frac{x}{2}(1-y)}\right)\left(C^{III}_{(1-x)z}\,D^{III}_{(1-x)(1-z)}\right)\left(E^{IV}_{xt/2}\,F^{IV}_{\frac{x}{2}(1-t)}\right)\right]$$

$$[G^{V}_{u}\,H^{V}_{1-u}]$$

wherein $0<(x, y, z, t, u)<1$.

An example of such a crystal composition formed of Zn, Cd, Ga, In, Ge, Sn, As and P, with $x=0.4$, $y=0.2$, $z=0.5$, $t=0.5$, $u=0.6$, is as follows:

(32) $Zn_{.04}Cd_{.16}Ga_{.30}In_{.30}Ge_{.10}Sn_{.10}As_{.60}P_{.40}$

The partial substitution of the components by elements from the same group of the periodic system affords, among other things, a particularly pronounced modification in heat conductance of the semiconductor body. Hence, such semiconductor bodies are likewise well suitable for semiconducting devices in which use is made of the thermoelectric properties of the semiconductor body and where it is essential to have a largest feasible ratio of electric to thermal conductance.

Like the known $A^{III}B^{V}$ compounds and the known $A^{III}B^{V}$ substitutes, the crystals according to the invention can be doped with lattice defection atoms acting as donor or acceptor. The mix-crystals therefore are readily producible, and can be processed, by the conventional methods, such as zone melting, for operation as extrinsic semiconductors of n-type or p-type conductance, and the known p-n junction techniques are applicable in the same manner as for the mixed crystals according to the above-mentioned Patent 2,858,275. Thus, as mentioned above, the semiconductor members 12 and 13 of the device illustrated in FIG. 2 of the accompanying drawings may consist of the same solid solution of an $A^{III}B^{V}$ compound and one of its substitutes of the type $C^{II}D^{I}B^{V}_2$, except that the members 12 have n-type conductance whereas the members 13 are doped for p-type conductance.

The mix-crystals or solid solutions to be used according to the invention can be produced by melting the two component compounds, or the individual elements, together in stoichiometric proportions and thereafter subjecting the resulting crystalline body to zone-refining to the extent necessary.

In cases where the composition comprises one or more elements that evaporate at relatively low temperatures, or if the composition tends to decompose when molten, the so-called two-temperature method is preferable. This is the case, for example, when the composition to be produced contains phosphorus as one of its constituent elements. The two-temperature method is described, for example, in the copending application Serial No. 534,852, filed September 16, 1955, as well as in my above-mentioned Patent 2,858,275, column 6, or in German Patents 960,268 and 1,029,803. Mixed crystals according to the invention, when produced by melting the semiconductor binary compound together with its substituted compound, can be pulled as a crystal or monocrystal out of the melt in the conventional manner. In conjunction with the known zone melting for purifying and/or homogenizing the semi-conductor crystals, the application of the above-mentioned two-temperature method is also of advantage.

While, as mentioned, the manufacture and further processing of mixed crystal devices according to the invention do not require departing from the known methods, with the exception of the different components, number of components, or quantities involved, an example will be described presently with reference to the two-temperature equipment and method according to Patent 2,858,275, as applied to the production of a mix-crystal of the composition (33): $(Zn_{0.4}In_{0.2}Ge_{0.4})As$, which appertains to the mix-crystal system (3) and is related to the examples (8) to (12) according to Table II.

The starting materials are hyper-pure elemental substances in pulverulent form, namely 4000 grams In, 4570 grams Zn, 5072 grams Ge, and 13,130 grams As. The accurately weighed quantities of In, Zn, Ge are placed in an elongated boat of graphite-coated quartz, having semicircular cross section, a length of 10 cm. and a width of about 1 cm. The boat and its contents, together with the quantity of As, are then sealed in a tubular quartz ampule of approximately 20 cm. length. The As quantity is placed beside the boat on the bottom of the ampule. The ampule is then placed into a two-temperature furnace in such a position that at first the boat and its content are heated to approximately 900° C. Thereafter the other end of the ampule, containing the quantity of As, is heated to approximately 700° C. (see FIG. 7 of Patent 2,858,275). As a result, the content of the boat is first melted, whereas the major portion of As will sublimate at the cold end of the ampule. Subsequently, the As passes through the vaporous phase into the melt. At the end of the process, substantially the entire weighed-in quantities are located in the boat in form of a melt. A portion of the As remains in the vaporous phase. Some minor precipitation, consisting essentially of Zn and As, appear on the tubular wall of the quartz ampule but in negligible quantities. Thereafter the ampule is shifted in the furnace so that gradually the entire content assumes the lower temperature of approximately 700° C. The desired mix-crystal then forms itself by normal freezing. The crystal is thereafter removed from the ampule and may be subjected to zone melting or any desired subsequent processing mentioned above.

While crystal composition of $A^{III}B^{V}$ compounds and their ternary substitutes have been found preferable for electrothermal and related or dependent purposes because of their particularly low thermal conductance, similar results are exhibited by other mix-crystal systems based upon the semiconducting $A^{II}B^{VI}$ compounds and their ternary substitutes, preferably of the type $C^{I}D^{III}B^{VI}_2$ Examples of this kind are:

(34) $(Cu_{x/2}Zn_{1-x}Ga_{x/2})S$
(35) $(Ag_{x/2}Zn_{1-x}Ga_{x/2})S$
(36) $(Ag_{x/2}Cd_{1-x}In_{x/2})Se$
(37) $(Ag_{x/2}Cd_{1-x}In_{x/2})Te$

The general formula corresponding to the above type is therefore:

$$(A^{II}_{1-x}B^{VI})(C^{I}_{x/2}D^{III}_{x/2}B^{VI}_2)$$

The sum of $B^{VI}$ and $B^{VI}_2$ is one; compare Formulas 26 to 29.

Also among the mix-crystals of the type AB–CDB$_2$ are the binary compounds known as semiconductors of the form $A^{IV}B^{VI}$ in mixture or solution with the likewise known semiconductors of the ternary type $C^{I}D^{V}B^{VI}_2$ which, from the viewpoint of the present invention, can be looked upon as being substituted $A^{IV}B^{VI}$ compounds. Mix-crystals thus consisting of a binary $A^{IV}B^{VI}$ compound and a ternary substitute of that compound are of the type $$(C^{I}_{x/2}A^{IV}_{(1-x)}D^{V}_{x/2})B^{II}$$

wherein $0<x<1$.

In such systems, too, the individual elemental components may be partly substituted by another element from the same group of the periodic system. In the more general case, the stoichiometric formula of such a mix-crystal is:

$$\left[\left(A^{I}_{xy/2}B^{I}_{\frac{x}{2}(1-y)}\right)\left(C^{IV}_{(1-x)z}D^{IV}_{(1-x)(1-z)}\right)\left(E^{V}_{xt/2}F^{V}_{\frac{x}{2}(1-t)}\right)\right]$$

$$[G^{VI}_{u}H^{VI}_{(1-u)}]\ 0<(x, y, z, t, u)<1$$

According to Debye-Scherrer diagrams, such substances crystallize in form of the MaCl-lattice or in a crystal lattice corresponding to a slightly distorted NaCl-lattice, the components in one of the rectangular brackets [ ] distributing themselves statistically over one of the two cube-face centered component grids of the NaCl-lattice.

An advantage in the use of these mixed crystals, aside from those already mentioned, is the fact that elements as heavy as Pb and Bi are suitable as components. Such use of heavy elements is another possibility of reducing the thermal conductance. A further advantage is the fact that a number of these crystal compounds—namely those which contain mainly Te as an element of the sixth group—can be readily produced by melting the components or elements together in an open system. The other compounds can be produced in accordance with the methods mentioned above, particularly the two-temperature method.

The following elements are particularly suitable for the formation of mixed crystals of the type $$A^{IV}B^{VI}C^{I}D^{V}B^{VI}_2$$

Elements of group Ib: Cu, Ag, Au
Elements of group IVb: Si, Ge, Sn, Pb
Elements of group Vb: P, As, Sb, Bi
Elements of group VIb: S, Se, Te Particularly favorable among the mixed-crystal systems made and tested were the following:

(38) $(Ag_{x/2}Sn_{(1-x)}Sb_{x/2})Te, 0<x<1$
(39) $(Ag_{x/2}Sn_{(1-x)}Bi_{x/2})Te, 0<x<1$
(40) $(Ag_{x/2}Pb_{(1-x)}Bi_{x/2})Te, 0<x<1$
(41) $(Ag_{x/2}Pb_{(1-x)}Sb_{x/2})Te, 0<x<1$

(42) $$\left[\left(Au_{xy/2}Ag_{\frac{x}{2}(1-x)}\right)\left(Sn_{(1-x)z}Pb_{(1-x)(1-z)}\right)\left(Bi_{xt/2}Sb_{\frac{x}{2}(1-t)}\right)\right]$$

$$[Te_{u}Se_{(1-u)}]\ 0<(x, y, z, t, u)<1$$

Figure 6:
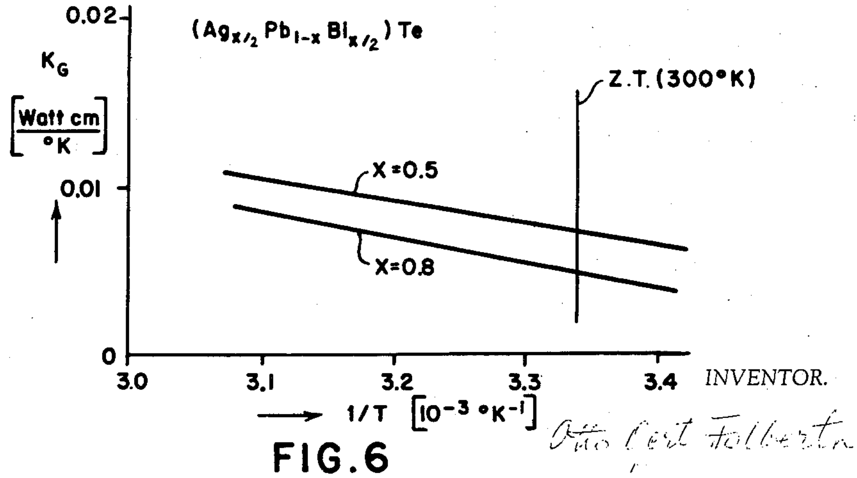

The diagrams shown in FIGS. 5 and 6 of the drawing are based upon measurements made with the mix-crystal (40): $(Ag_{x/2}Pb_{(1-x)}Bi_{x/2})Te$. The lattice thermal conductance at 300° K. was found to be less than $10^{-2}$ (watt degree$^{-1}$ cm.$^{-1}$). This is lower than the best known values of the system $Bi_2(Te_{1-y}Se_y)_3+Ag$. For a value $x$ of approximately 0.75 there exists a minimum of about $5 \cdot 10^{-3}$ (watt degree$^{-1}$ cm.$^{-1}$) as is apparent from FIG. 5. The heat conductance thus is three to four times lower than with the best available mix-crystals on $Bi_2Te_3$ basis.

With increasing temperature, the thermal conductance rapidly increases (FIG. 6) as is the case with $Bi_2Te_3$. The heat conductance of specimens containing an optimum amount of doping substance is still lower than mentioned above.

The above-mentioned doping methods as well as the conventional p-n junction techniques, such as alloying, diffusion bonding, are also applicable to the mixed crystals of the type last discussed. Applicable also is the method, known for $A^{IV}B^{VI}$ compounds, of doping the crystals with the aid of slight departures from accurate stoichiometry. The above-mentioned methods of melting, refining, crystal pulling, homogenizing are likewise applicable.

In most of the above-described semiconductor devices according to the invention, the binary-group and the ternary-group components of the mixed crystal are each, considered by themselves, a semiconductor. This is notably so with the binary-ternary mix-crystals based upon an $A^{III}B^{V}$ compound and one of its ternary substitutes. However, this is not necessarily the case with other binary-ternary mix-crystal semiconductors according to the invention. I have found that an electrically applicable semiconductor of this type may also be formed of a binary compound and a ternary substitute compound of which only one, taken by itself, is a semiconductor in the strict sense, whereas the other is an appreciably ionically bonded or predominantly metallic compound that would not be suitable for electric semiconductor purposes if used alone. Thus, in the mix-crystal (38) of SnTe and $AgSbTe_2$, only the ternary compound AgSbTe is a semiconductor, whereas the electric properties of SnTe are degenerated to such an extent as to make this compound a metallic conductor, in contrast to such compounds as PbTe, PbSe, PbS or GeTe.

As pointed out above, the solid-solution or mixed-crystal substances to be used for semiconductor devices according to the invention are stoichiometric. The outstanding phenomenon peculiar to these multi-element substances, namely a markedly greater reduction in thermal conductance, compared with electric conductance, was found to be dependent upon stoichiometry and may become overshadowed by other phenomena if the compositions appreciably depart from stoichiometry. It is to be understood, of course, that ideal stoichiometry cannot and need not always be attained and that no discernable impairment of the desired properties may occur if such departures remain slight. In general, it can be stated that in the above-given formulas the value of *x*, *y*, etc., indicative of the atomic proportions, must be above 0.001, and that departures below this value from the exact stoichiometry are harmless. This means that the upper limit of *x* must be no more than 0.999. The use of donor or acceptor atoms for imparting n-type or p-type electric conductance to the crystal does not disturb the stoichiometric proportions and has no influence upon the thermo-conductance properties, such doping substances being present in an atom percentage several decimal orders of magnitude below 0.001.

I claim:

1. A semiconductor device comprising a mixed-crystal semiconductor body formed of $(Ag_{x/2}Sn_{(1-x)}Sb_{x/2})Te$, wherein $0.001<x<1$.

2. A semiconductor device comprising a mixed-crystal semiconductor body formed of $(Ag_{x/2}Sn_{(1-x)}Bi_{x/2})Te$, wherein $0.001<x<1$.

3. A semiconductor device comprising a mixed-crystal semiconductor body formed of $(Ag_{x/2}Pb_{(1-x)}Bi_{x/2})Te$, wherein $0.001<x<1$.

4. A semiconductor device comprising a mixed-crystal semiconductor body formed of $(Ag_{x/2}Pb_{(1-x)}Sb_{x/2})Te$, wherein $0.001<x<1$.

5. A semiconductor device comprising a mixed-crystal semiconductor body formed of $$\left[\left(Au_{xy/2}Ag_{\frac{x}{2}(1-x)}\right)\left(Sn_{(1-x)z}Pb_{(1-x)(1-z)}\right)\left(Bi_{xt/2}Sb_{\frac{x}{2}(1-t)}\right)\right]$$

$$[Te_uSe_{(1-u)}]$$

wherein $0.001<(x, y, z, t, u)<1$.

6. A semiconductor device comprising a mixed-crystal semiconductor body formed of $(Ag_{x/2}Pb_{(1-x)}Bi_{x/2})Te$, wherein *x* ranges from 0.7 to 0.8.

References Cited by the Examiner

UNITED STATES PATENTS 2,882,468 4/1959 Wernick ----------- 252—62.3

OTHER REFERENCES

Wernick et al.: "Constitution of the $AgSbSe_2$–$AgSbTe_2$–$AgBiSe_2$–$AgBiTe_2$ System," J. Phys. & Che. Solids, vol. 7, November 1958, pages 240–248.

TOBIAS E. LEVOW, *Primary Examiner.*

R. D. EDMONDS, *Assistant Examiner.*

MAURICE A. BRINDISI, *Examiner.*